US012801886B2

(12) United States Patent
Lin

(10) Patent No.: US 12,801,886 B2

(45) Date of Patent: Nov. 17, 2026

(54) ANTENNA CONNECTION FOR INTEGRATED RFID TAG AND TPMS SENSOR

(71) Applicant: The Goodyear Tire & Rubber Company, Akron, OH (US)

(72) Inventor: Cheng-Hsiung Lin, Hudson, OH (US)

(73) Assignee: The Goodyear Tire & Rubber Company, Aron, OH (US)

( * ) Notice: Subject to any disclaimer, the term of this patent is extended or adjusted under 35 U.S.C. 154(b) by 0 days.

(21) Appl. No.: 19/304,837

(22) Filed: Aug. 20, 2025

(65) Prior Publication Data

US 2025/0367985 A1 Dec. 4, 2025

Related U.S. Application Data

(62) Division of application No. 18/047,339, filed on Oct. 18, 2022, now abandoned.

(60) Provisional application No. 63/281,893, filed on Nov. 22, 2021.

(51) Int. Cl.

| | |
|---|---|
| ***G06K 19/077*** | (2006.01) |
| ***B60C 23/04*** | (2006.01) |
| ***G01L 17/00*** | (2006.01) |
| ***H01Q 1/22*** | (2006.01) |
| ***H05K 1/11*** | (2006.01) |
| ***H05K 1/181*** | (2026.01) |

(52) U.S. Cl.

CPC .... *G06K 19/07764* (2013.01); *B60C 23/0452* (2013.01); *G01L 17/00* (2013.01); *G06K 19/07773* (2013.01); *H01Q 1/2241* (2013.01); *H05K 1/111* (2013.01); *H05K 1/181* (2013.01); *H05K 2201/09036* (2013.01); *H05K 2201/10098* (2013.01); *H05K 2201/10151* (2013.01)

(58) Field of Classification Search

CPC ....... G06K 19/07764; G06K 19/07773; G06K 19/07754; G06K 19/07786; B60C 23/0452; G01L 17/00; H01Q 1/2241; H01Q 1/1207; H01Q 1/362; H01Q 1/38; H01Q 9/16; H01Q 9/42; H05K 1/111; H05K 1/181; H05K 2201/09036; H05K 2201/10098; H05K 2201/10151

See application file for complete search history.

(56) References Cited

U.S. PATENT DOCUMENTS 10,254,499 B1 * 4/2019 Cohen .................. B23K 1/0016

* cited by examiner

*Primary Examiner* — Daryl C Pope

(74) *Attorney, Agent, or Firm* — Edward T. Kennedy

(57) ABSTRACT

An integrated radio frequency identification tag and tire pressure monitoring system sensor includes a radio frequency identification tag. The radio frequency identification tag includes an integrated circuit, and a printed circuit board carries the integrated circuit. A tire pressure monitoring system sensor is mounted on the radio frequency identification tag. An antenna includes at least one coil antenna wire. The antenna wire is formed in a helical shape and is electrically connected to the integrated circuit. A first end of the antenna wire is mounted to the printed circuit board. A mechanical interlock between the first end of the antenna wire and the printed circuit board includes features that secure the first end of the antenna wire to the printed circuit board.

4 Claims, 10 Drawing Sheets

ANTENNA CONNECTION FOR INTEGRATED RFID TAG AND TPMS SENSOR

FIELD OF THE INVENTION

The invention relates to tires and components for tires. More particularly, the invention relates to components for tire identification and the monitoring of tire pressure. Specifically, the invention is directed to an integrated radio frequency identification tag and tire pressure monitoring system sensor that includes an antenna connection to a printed circuit board which provides secure and consistent placement and alignment of the antenna for optimum performance.

BACKGROUND OF THE INVENTION

Pneumatic tires have been widely employed. Such tires include a pair of beads that are mounted on a wheel or rim. Each one of pair of sidewalls extends from a respective bead to a ground-engaging tread. A carcass, which is made of one or more plies, toroidally extends between the beads to reinforce the sidewalls and the tread. An innerliner is formed on the inside surface of the carcass. The wheel cooperates with the innerliner to define an interior or tire cavity that is inflated with air.

It has been desirable to provide such pneumatic tires with an electronic device that enables information about the tire to be transmitted to an external device for tracking of certain parameters and identification of the tire during its lifetime. One such electronic device is a radio frequency identification (RFID) device, sometimes referred to as an RFID tag.

Most RFID tags include an integrated circuit for storing and processing information and an antenna for receiving and transmitting a signal to an external reader using a radio frequency. The antenna is electronically connected to the integrated circuit and typically is carried on a substrate with the integrated circuit, such as a circuit board.

In the prior art, RFID tags were attached to the exterior of a sidewall of a pneumatic tire. The exterior of a tire sidewall provides a convenient location that enables strong transmission of the signal from the RFID tag to an RFID reader, which is separate from the tire. However, the RFID tag may incur potential damage when it is attached to the exterior of a tire sidewall. To reduce such potential damage, it has become desirable to attach the RFID tag to an interior structure of the tire.

In addition, it is desirable to monitor certain parameters, such as the pressure in the tire cavity, the temperature in the tire cavity and/or the temperature in the tread or another tire component, and to transmit data for those parameters to a device that can record and/or display the data. To this end, tire pressure monitoring systems (TPMS) have been developed. Many TPMS configurations employ a pressure and/or temperature sensor that is mounted to the tire, which is referred to as a TPMS sensor. Due to power and communication requirements of TPMS sensors, TPMS units have been separate from RFID tags. However, mounting of separate TPMS sensors and RFID tags in a tire is undesirable.

To provide more efficient mounting in a tire, an integrated RFID tag and TPMS sensor has been developed. The integrated RFID tag and TPMS sensor includes a printed circuit board and a coil antenna that is electronically attached to the printed circuit board. In the prior art, the antenna coil has been directly placed on the printed circuit board and solder has been applied to bond the antenna to the surface of the printed circuit board. However, the efficiency and performance of the integrated RFID tag and TPMS sensor may be significantly affected by issues encountered with the prior art attachment technique.

For example, it may be difficult to place the coil antenna at a repeatable, exact location on the printed circuit board, creating difficulty in installation and leading to undesirable variation in alignment and antenna length. Such variation in turn may interfere with the performance of the integrated RFID tag and TPMS sensor. In addition, there is limited surface contact between the coil antenna and the surface of the printed circuit board for soldering, which may cause undesirable variation in the strength of the bond between the antenna and the printed circuit board and may decrease the durability of the bond. Further, when two coil antennas are mounted to the printed circuit board, the antennas are typically soldered to separate areas on the surface of the printed circuit board. The separate areas may create a different wave form contact between the two antennas, which may impair the efficiency and performance of the antennas.

As a result, there is a need in the art for an integrated radio frequency identification tag and tire pressure monitoring system sensor that includes an antenna connection to a printed circuit board which provides consistent placement and alignment of the antenna for optimum performance.

SUMMARY OF THE INVENTION

According to an aspect of an exemplary embodiment of the invention, an integrated radio frequency identification tag and tire pressure monitoring system sensor includes a radio frequency identification tag. The radio frequency identification tag includes an integrated circuit, and a printed circuit board carries the integrated circuit. A tire pressure monitoring system sensor is mounted on the radio frequency identification tag. An antenna includes at least one coil antenna wire, in which the at least one antenna wire is formed in a helical shape and is electrically connected to the integrated circuit. The at least one antenna wire includes a first end that is mounted to the printed circuit board. A mechanical interlock between the first end of the antenna wire and the printed circuit board includes features that secure the first end of the antenna wire to the printed circuit board.

DEFINITIONS

"Axial" and "axially" mean lines or directions that are parallel to the axis of rotation of the tire.

"Axially inward" and "axially inwardly" refer to an axial direction that is toward the axial center of the tire.

"Axially outward" and "axially outwardly" refer to an axial direction that is away from the axial center of the tire.

"Circumferential" means lines or directions extending along the perimeter of the surface of the annular tread perpendicular to the axial direction.

"Inboard" refers to the axial inner surface of the tire as mounted on the vehicle.

"Innerliner" means the layer or layers of elastomer or other material that form the inside surface of a tubeless tire and that contain the inflating fluid within the tire.

"Outboard" refers to the axial outer surface of the tire as mounted on a vehicle.

"Radial" and "radially" mean lines or directions that are perpendicular to the axis of rotation of the tire.

"Radially inward" and "radially inwardly" refer to a radial direction that is toward the central axis of rotation of the tire.

"Radially outward" and "radially outwardly" refer to a radial direction that is away from the central axis of rotation of the tire.

"RFID" means radio frequency identification.

"TPMS" means a tire pressure monitoring system.

BRIEF DESCRIPTION OF THE DRAWINGS

The invention will be described by way of example and with reference to the accompanying drawings, in which.

Similar numerals refer to similar parts throughout the drawings.

DETAILED DESCRIPTION OF THE INVENTION

Exemplary embodiments of an integrated RFID tag and TPMS sensor of the present invention are shown in FIGS. 1 and 3A-10G, and are indicated at 10A-10H, respectively. The integrated RFID tag and TPMS sensor is preferably employed in a tire 12.

Figure 1:
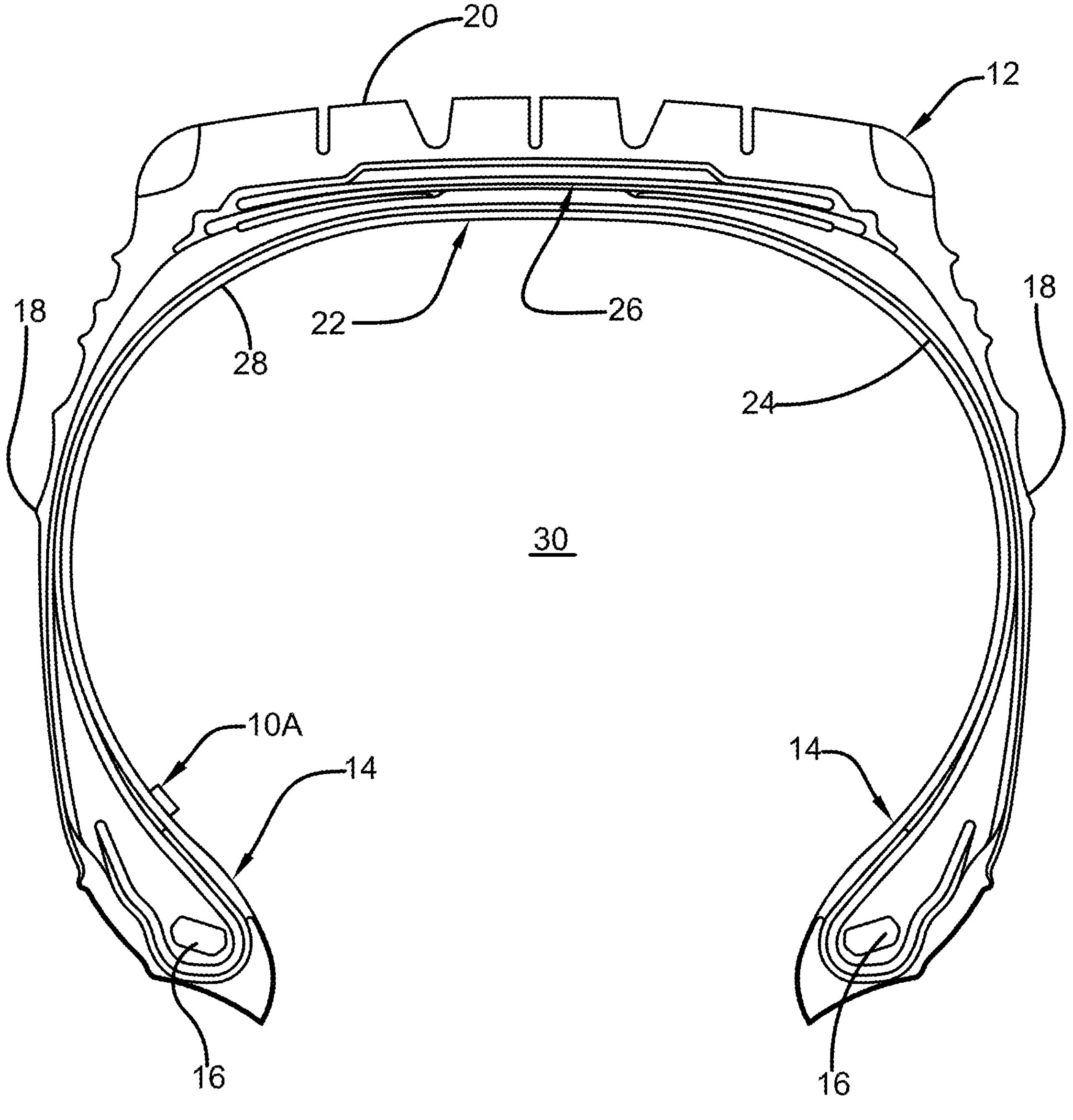
FIG. 1 is a cross-sectional view of an exemplary pneumatic tire with a first exemplary embodiment of an integrated RFID tag and TPMS sensor of the present invention.
Figure 2D:
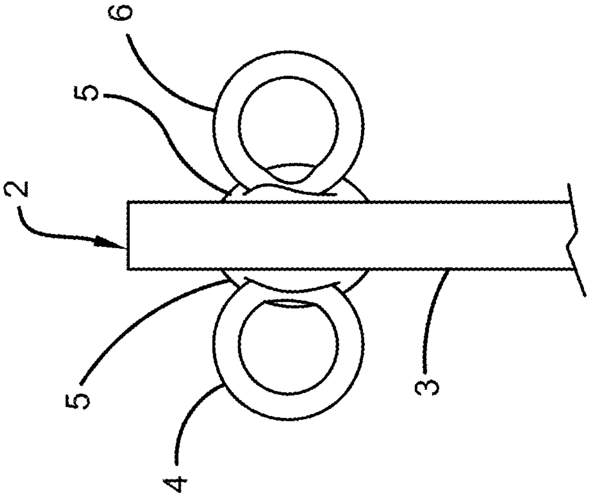
FIG. 2D PRIOR ART
FIG. 2D is an enlarged end view of a portion of the integrated RFID tag and TPMS sensor shown in FIG. 2C.
Figure 2C:
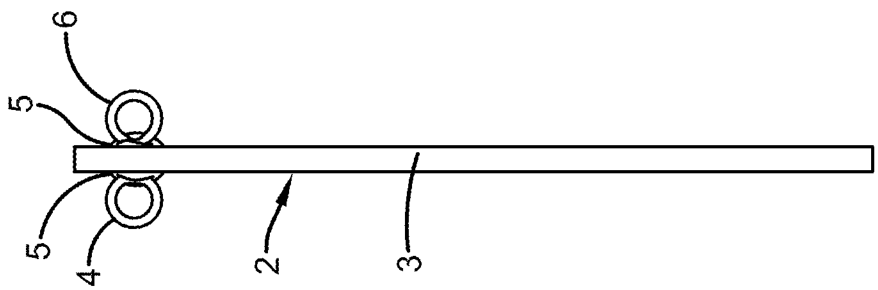
FIG. 2C PRIOR ART
FIG. 2C is an end view of the integrated RFID tag and TPMS sensor shown in FIG. 2A.
Figure 2A:
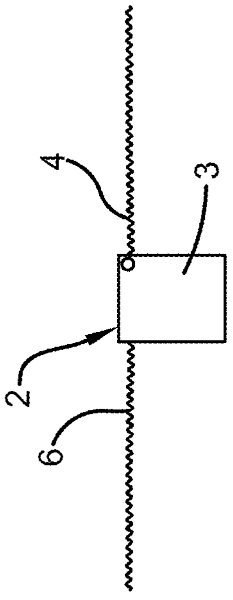
FIG. 2A PRIOR ART
FIG. 2A is a plan view of an integrated RFID tag and TPMS sensor of the prior art.
Figure 2B:
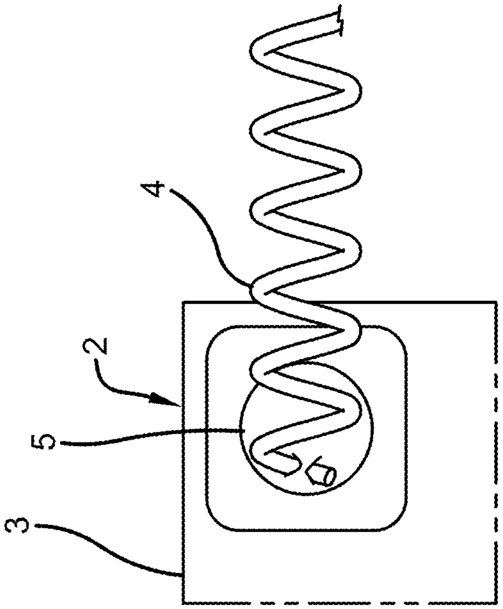
FIG. 2B PRIOR ART
FIG. 2B is an enlarged plan view of a portion of the integrated RFID tag and TPMS sensor shown in FIG. 2A.
Figures 3A, 3B, 3C, 3D, 3E, 3F:
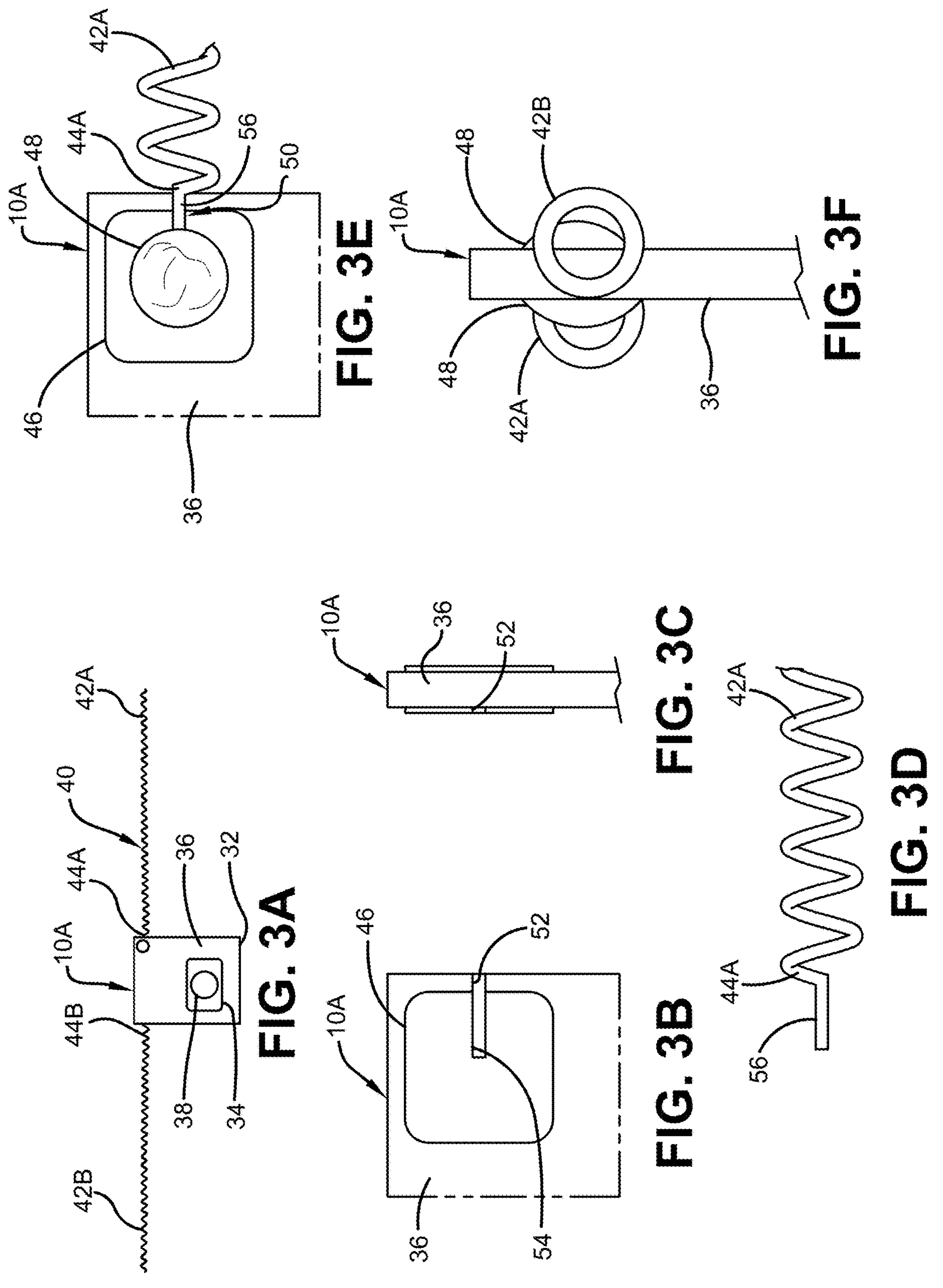
FIG. 3A is a plan view of a first exemplary embodiment of an integrated RFID tag and TPMS sensor of the present invention.
FIG. 3B is an enlarged plan view of a portion of a printed circuit board of the integrated RFID tag and TPMS sensor shown in FIG. 3A.
FIG. 3C is an end view of a portion of the printed circuit board of the integrated RFID tag and TPMS sensor shown in FIG. 3B.
FIG. 3D is an enlarged plan view of a portion of an antenna of the integrated RFID tag and TPMS sensor shown in FIG. 3A.
FIG. 3E is an enlarged plan view of a portion of the integrated RFID tag and TPMS sensor shown in FIG. 3A.
FIG. 3F is an enlarged end view of a portion of the integrated RFID tag and TPMS sensor shown in FIG. 3A.
Figures 4A, 4B, 4C, 4D, 4E, 4F:
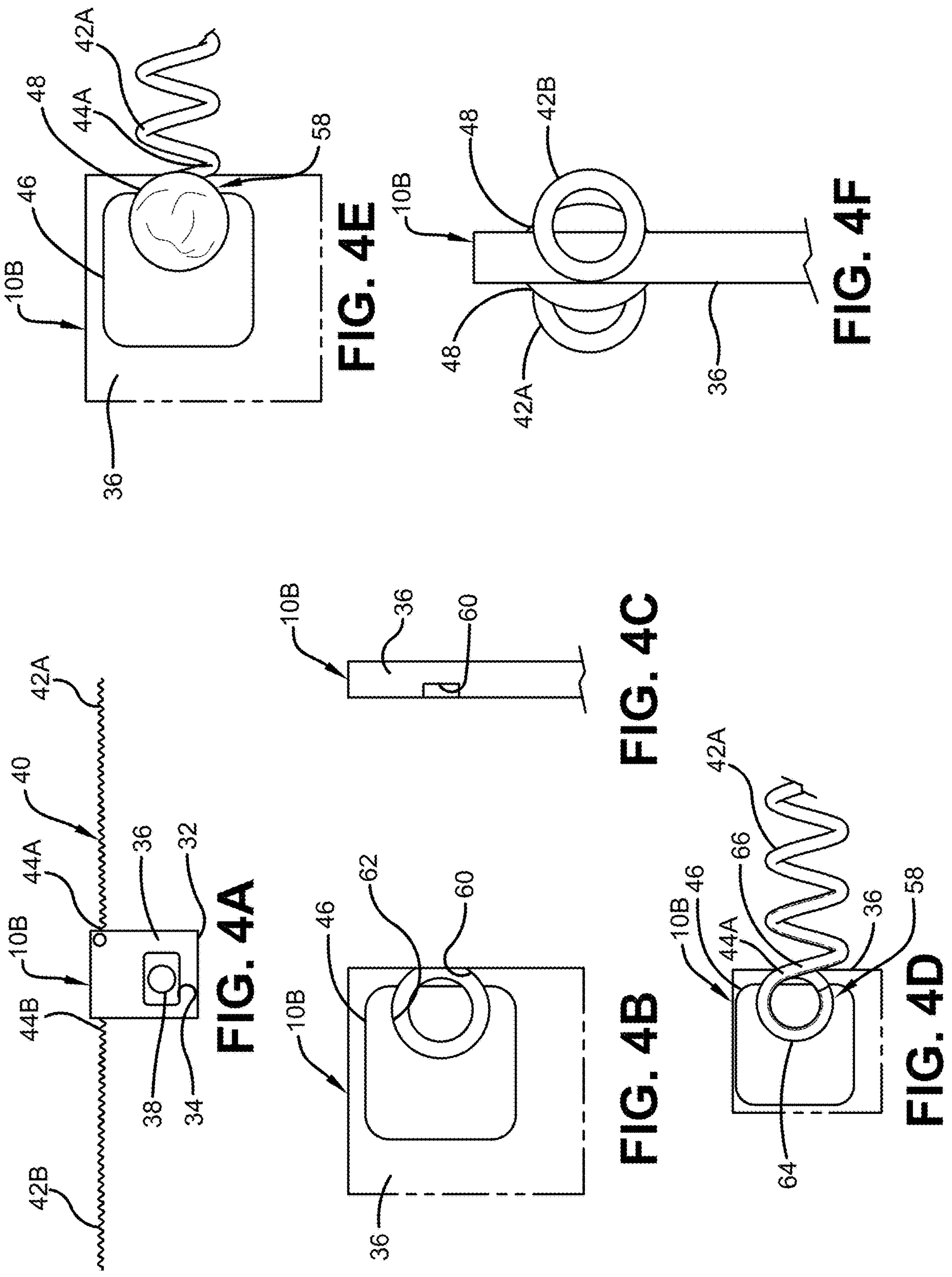
FIG. 4A is a plan view of a second exemplary embodiment of an integrated RFID tag and TPMS sensor of the present invention.
FIG. 4B is an enlarged plan view of a portion of a printed circuit board of the integrated RFID tag and TPMS sensor shown in FIG. 4A.
FIG. 4C is an end view of a portion of the printed circuit board of the integrated RFID tag and TPMS sensor shown in FIG. 4B.
FIG. 4D is an enlarged plan view of a portion of a printed circuit board and an antenna of the integrated RFID tag and TPMS sensor shown in FIG. 4A.
FIG. 4E is an enlarged plan view of a portion of the integrated RFID tag and TPMS sensor shown in FIG. 4A.
FIG. 4F is an enlarged end view of a portion of the integrated RFID tag and TPMS sensor shown in FIG. 4A.
Figures 5A, 5B, 5C, 5D, 5E, 5F, 5G, 5H:
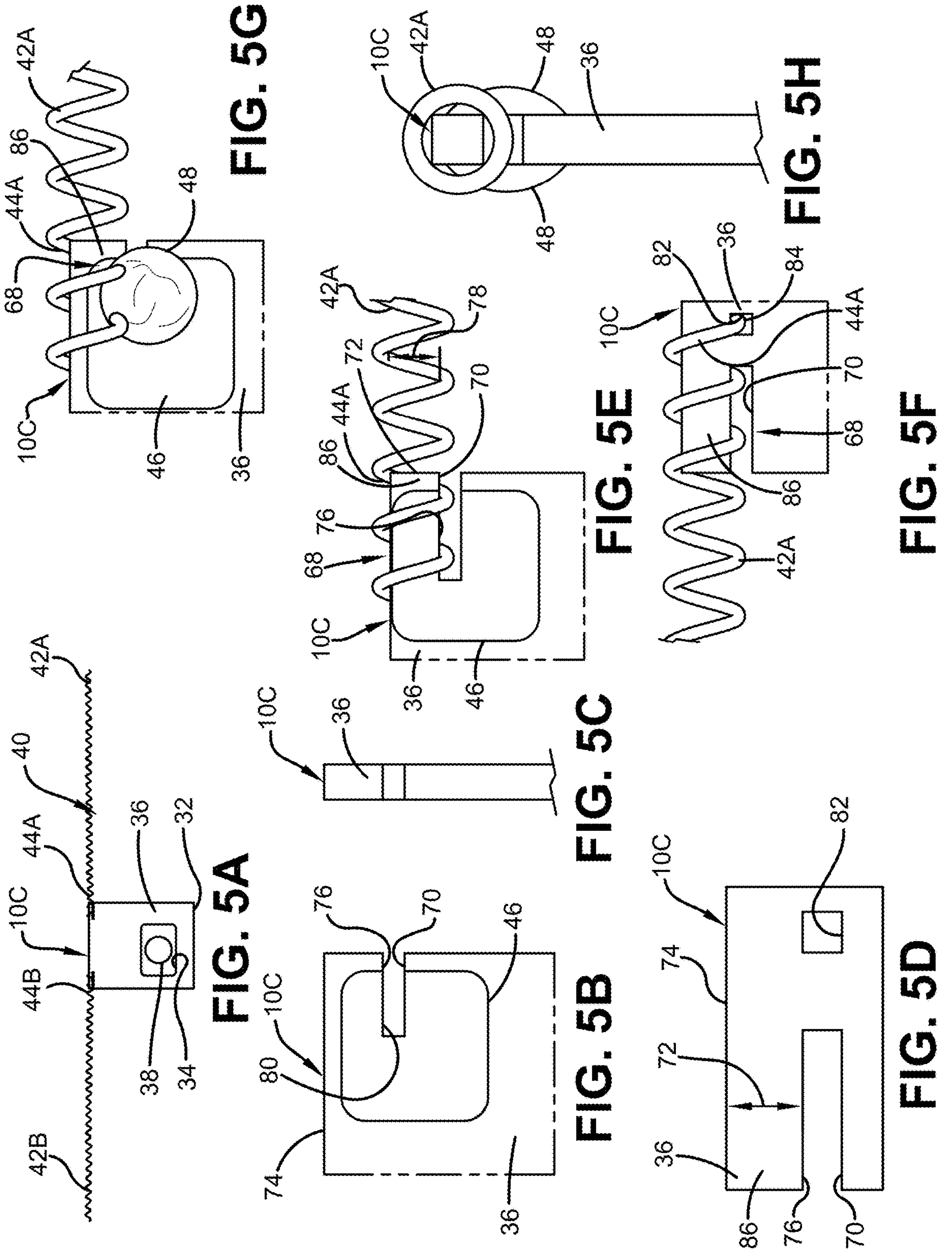
FIG. 5A is a plan view of a third exemplary embodiment of an integrated RFID tag and TPMS sensor of the present invention.
FIG. 5B is an enlarged plan view of a portion of the printed circuit board of the integrated RFID tag and TPMS sensor shown in FIG. 5A.
FIG. 5C is an end view of a portion of the printed circuit board of the integrated RFID tag and TPMS sensor shown in FIG. 5B.
FIG. 5D is an enlarged plan view of another portion of the printed circuit board of the integrated RFID tag and TPMS sensor shown in FIG. 5A.
FIG. 5E is an enlarged plan view of a portion of a printed circuit board and an antenna of the integrated RFID tag and TPMS sensor shown in FIG. 5A.
FIG. 5F is an enlarged plan view of another portion of a printed circuit board and an antenna of the integrated RFID tag and TPMS sensor shown in FIG. 5A.
FIG. 5G is an enlarged plan view of a portion of the integrated RFID tag and TPMS sensor shown in FIG. 5A.
FIG. 5H is an enlarged end view of a portion of the integrated RFID tag and TPMS sensor shown in FIG. 5A.
Figure 6D:
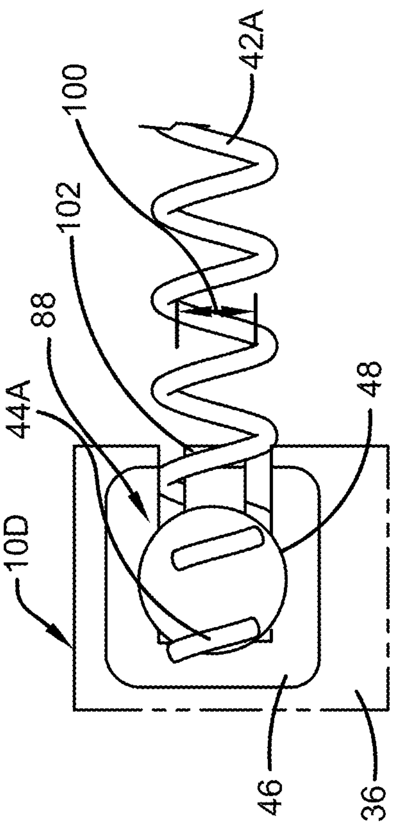
FIG. 6D is an enlarged plan view of a portion of the integrated RFID tag and TPMS sensor shown in FIG. 6A.
Figure 6E:
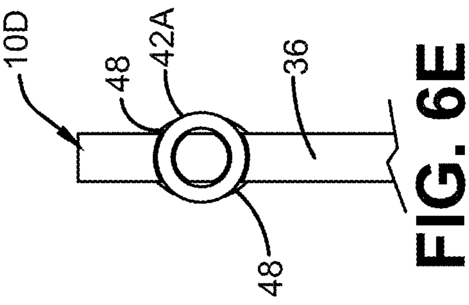
FIG. 6E is an enlarged end view of a portion of the integrated RFID tag and TPMS sensor shown in FIG. 6A.
Figure 6A:
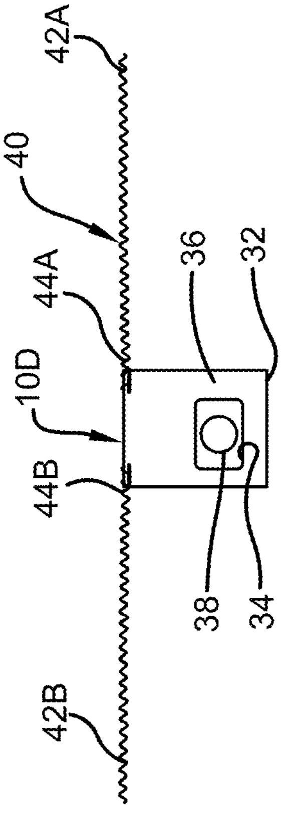
FIG. 6A is a plan view of a fourth exemplary embodiment of an integrated RFID tag and TPMS sensor of the present invention.
Figure 6B:
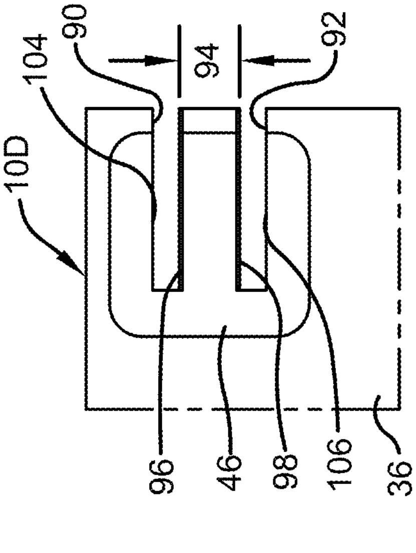
FIG. 6B is an enlarged plan view of a portion of a printed circuit board of the integrated RFID tag and TPMS sensor shown in FIG. 6A.
Figure 6C:
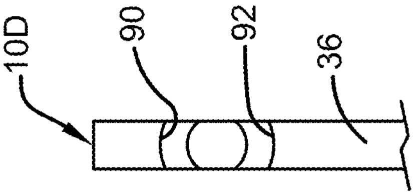
FIG. 6C is an end view of a portion of the printed circuit board of the integrated RFID tag and TPMS sensor shown in FIG. 6B.
Figures 7A, 7B, 7C, 7D, 7E, 7F:
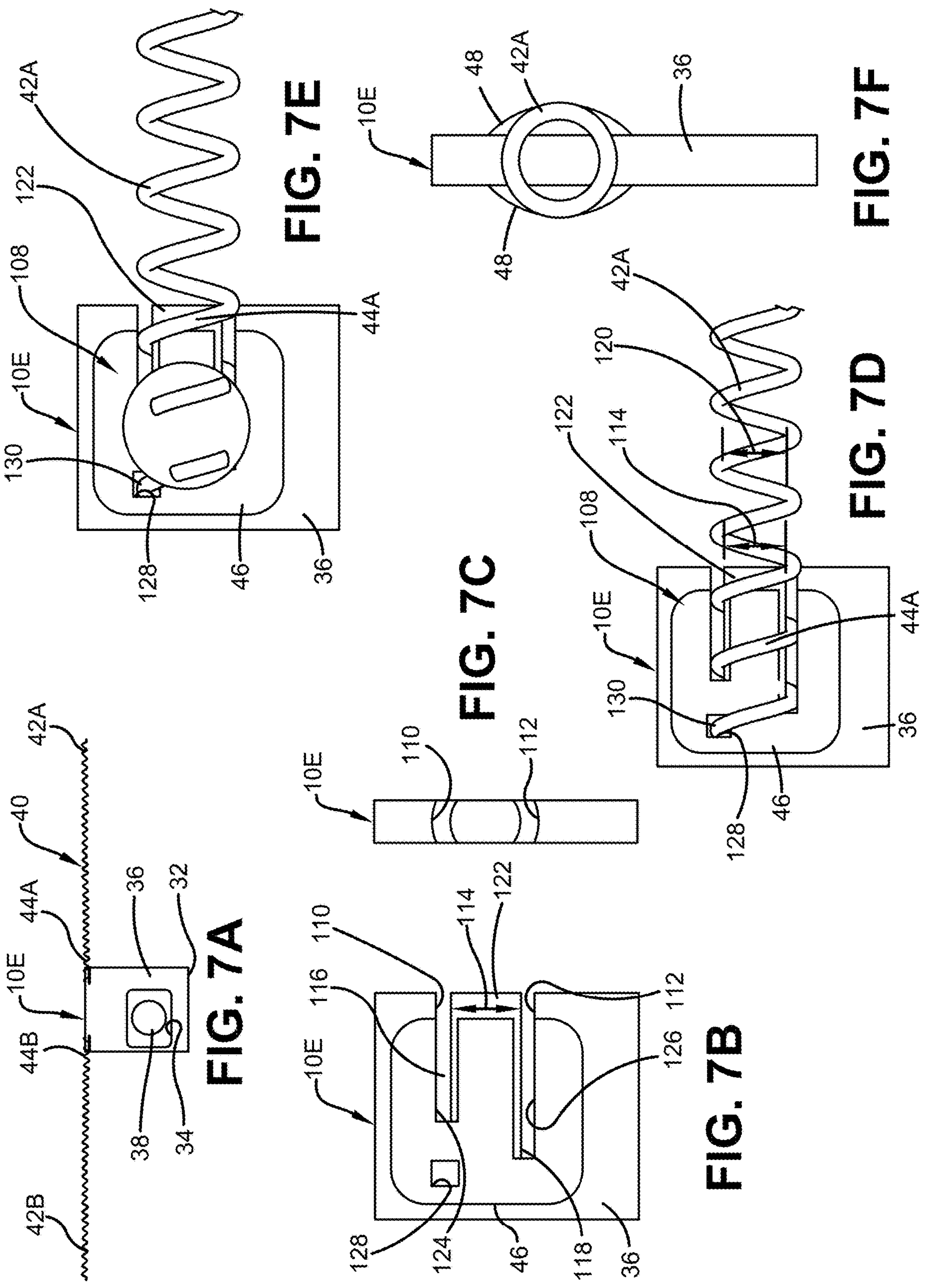
FIG. 7A is a plan view of a fifth exemplary embodiment of an integrated RFID tag and TPMS sensor of the present invention.
FIG. 7B is an enlarged plan view of a portion of a printed circuit board of the integrated RFID tag and TPMS sensor shown in FIG. 7A.
FIG. 7C is an end view of a portion of the printed circuit board of the integrated RFID tag and TPMS sensor shown in FIG. 7B.
FIG. 7D is an enlarged plan view of a portion of a printed circuit board and an antenna of the integrated RFID tag and TPMS sensor shown in FIG. 7A.
FIG. 7E is an enlarged plan view of a portion of the integrated RFID tag and TPMS sensor shown in FIG. 7A.
FIG. 7F is an enlarged end view of a portion of the integrated RFID tag and TPMS sensor shown in FIG. 7A.
Figures 8A, 8B, 8C, 8D, 8E, 8F:
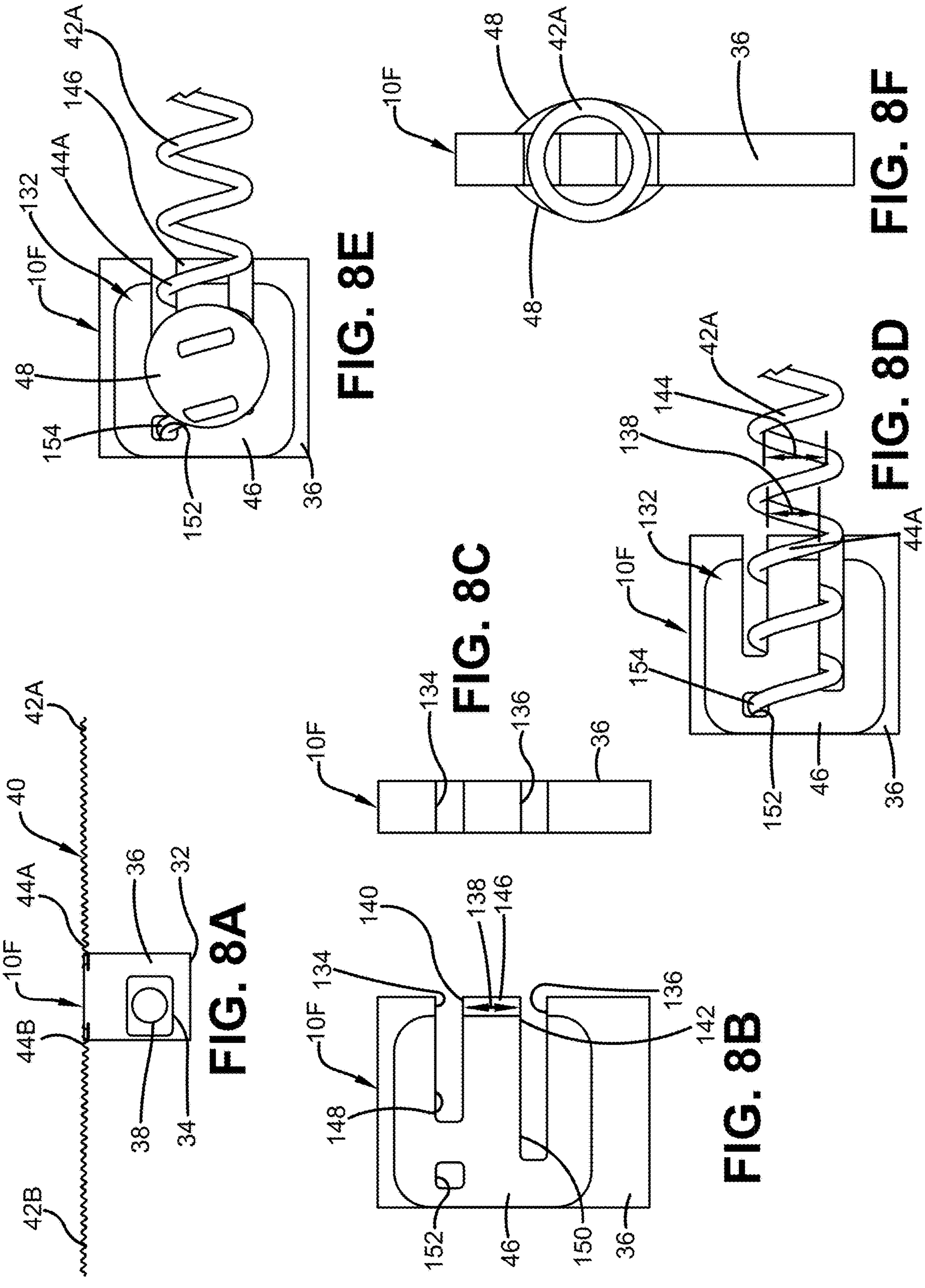
FIG. 8A is a plan view of a sixth exemplary embodiment of an integrated RFID tag and TPMS sensor of the present invention.
FIG. 8B is an enlarged plan view of a portion of a printed circuit board of the integrated RFID tag and TPMS sensor shown in FIG. 8A.
FIG. 8C is an end view of a portion of the printed circuit board of the integrated RFID tag and TPMS sensor shown in FIG. 8B.
FIG. 8D is an enlarged plan view of a portion of a printed circuit board and an antenna of the integrated RFID tag and TPMS sensor shown in FIG. 8A.
FIG. 8E is an enlarged plan view of a portion of the integrated RFID tag and TPMS sensor shown in FIG. 8A.
FIG. 8F is an enlarged end view of a portion of the integrated RFID tag and TPMS sensor shown in FIG. 8A.
Figures 9A, 9B, 9C, 9D, 9E, 9F:
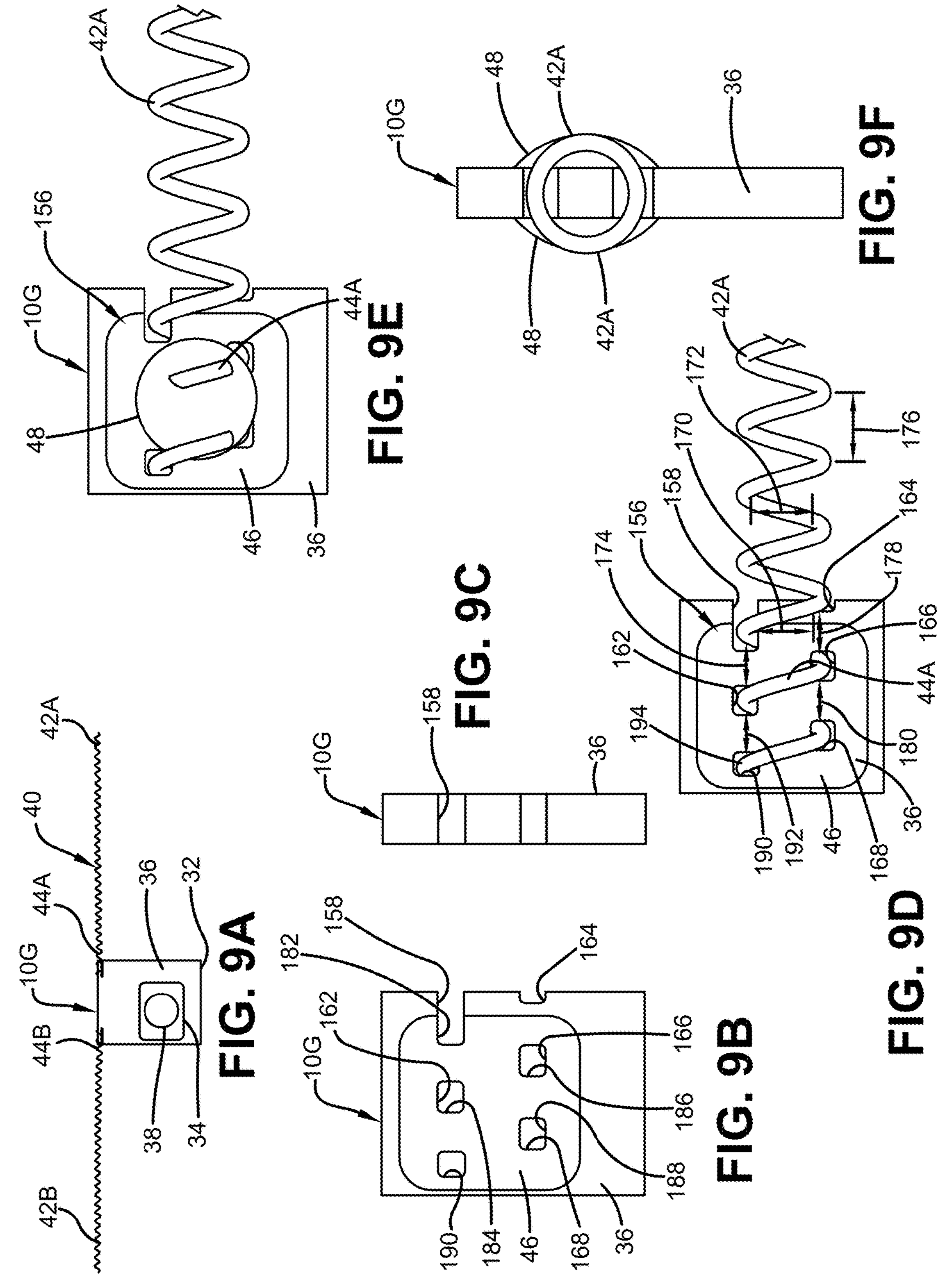
FIG. 9A is a plan view of a seventh exemplary embodiment of an integrated RFID tag and TPMS sensor of the present invention.
FIG. 9B is an enlarged plan view of a portion of a printed circuit board of the integrated RFID tag and TPMS sensor shown in FIG. 9A.
FIG. 9C is an end view of a portion of the printed circuit board of the integrated RFID tag and TPMS sensor shown in FIG. 9B.
FIG. 9D is an enlarged plan view of a portion of a printed circuit board and an antenna of the integrated RFID tag and TPMS sensor shown in FIG. 9A.
FIG. 9E is an enlarged plan view of a portion of the integrated RFID tag and TPMS sensor shown in FIG. 9A.
FIG. 9F is an enlarged end view of a portion of the integrated RFID tag and TPMS sensor shown in FIG. 9A.
Figures 10A, 10B, 10C, 10D, 10E, 10F, 10G:
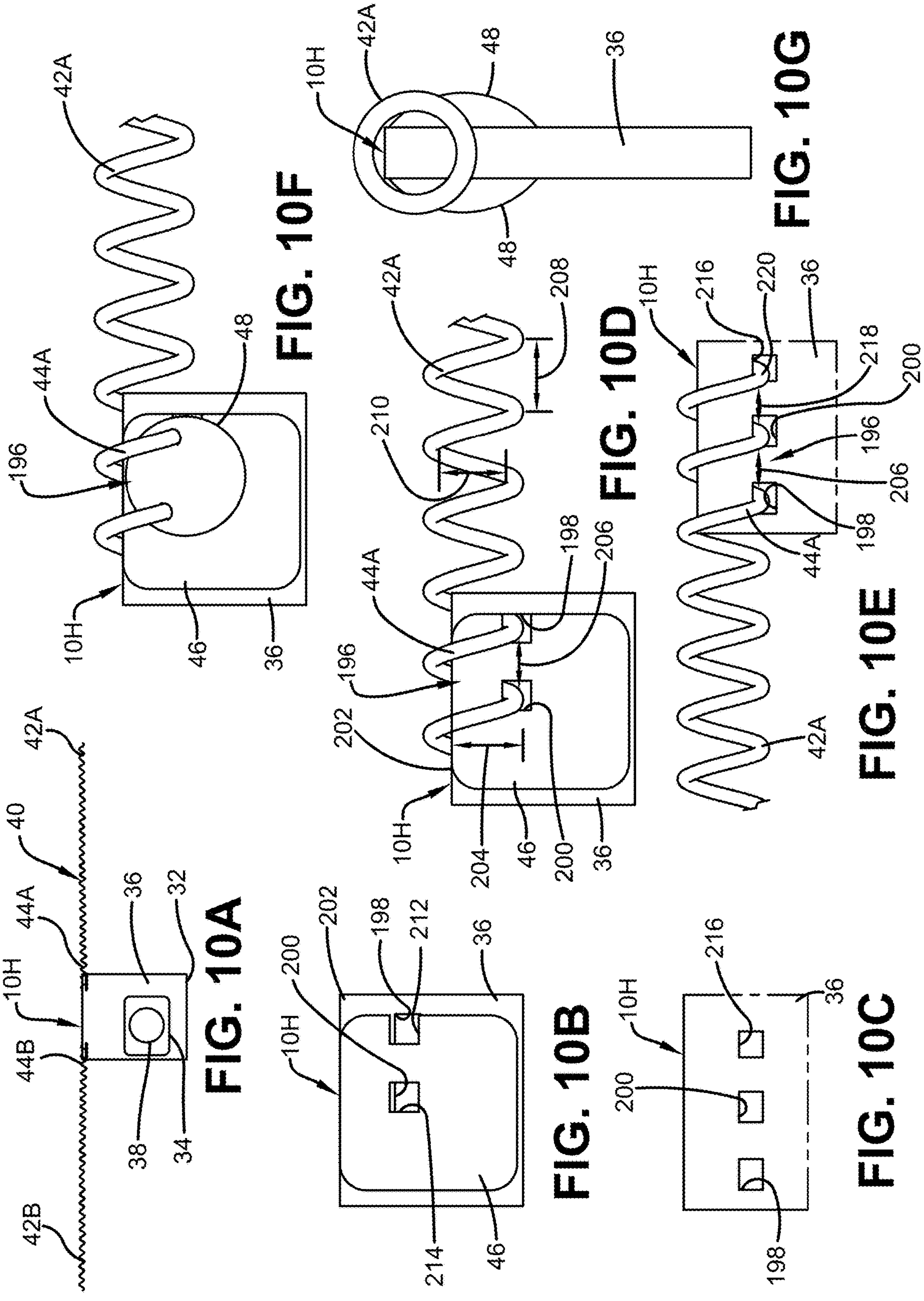
FIG. 10A is a plan view of an eighth exemplary embodiment of an integrated RFID tag and TPMS sensor of the present invention.
FIG. 10B is an enlarged plan view of a portion of a printed circuit board of the integrated RFID tag and TPMS sensor shown in FIG. 10A.
FIG. 10C is an enlarged plan view of another portion of a printed circuit board of the integrated RFID tag and TPMS sensor shown in FIG. 10A.
FIG. 10D is an enlarged plan view of a portion of a printed circuit board and an antenna of the integrated RFID tag and TPMS sensor shown in FIG. 10A.
FIG. 10E is an enlarged plan view of another portion of a printed circuit board and an antenna of the integrated RFID tag and TPMS sensor shown in FIG. 10A.
FIG. 10F is an enlarged plan view of a portion of the integrated RFID tag and TPMS sensor shown in FIG. 10A.
FIG. 10G is an enlarged end view of a portion of the integrated RFID tag and TPMS sensor shown in FIG. 10A.

For example, referring to FIG. 1, a first exemplary embodiment of the integrated RFID tag and TPMS sensor is indicated at 10A. The tire 12 includes a pair of bead areas 14 and a respective bead core 16 embedded in each bead area. A respective sidewall 18 extends radially outward from each bead area 14 to a ground-contacting tread 20. The tire 12 is reinforced by a carcass 22 that toroidally extends from one of the bead areas 12 to the other one of the bead areas. The carcass 20 includes at least one ply 24 that preferably winds around each bead core 16. A belt reinforcement package 26 preferably is disposed between the carcass 22 and the tread 20. An innerliner 28 is formed on the inside surface of the carcass 22. A tire cavity 30 is disposed inwardly of the innerliner 28.

When the tire 12 is mounted on a wheel (not shown) of a vehicle, as known in the art, the innerliner 28 cooperates with the wheel to render the tire cavity 30 airtight. The integrated RFID tag and TPMS sensor 10A preferably is mounted on the innerliner 28 of the tire 12 and is disposed in the tire cavity 30. Of course, all embodiments of the integrated RFID tag and TPMS sensor 10A-10H may be employed in the tire 12.

By way of background, turning to FIGS. 2A-2D, an integrated RFID tag and TPMS sensor of the prior art 2 is shown. The prior art integrated RFID tag and TPMS sensor 2 includes a printed circuit board 3 and a coil antenna 4 that is electronically attached to the printed circuit board. The coil antenna 4 is directly placed on the printed circuit board 3 and solder 5 is applied to bond the antenna to the printed circuit board. This structure may create issues, such as difficulty in placing the coil antenna 4 at a repeatable, exact location on the printed circuit board 3, leading to undesirable variation in alignment and antenna length. There is also limited surface contact between the coil antenna 4 and the printed circuit board 3 for soldering 5, which may cause undesirable variation in the strength of the bond between the antenna and the printed circuit board and a decrease in bond durability. When a second coil antenna 6 is mounted to the printed circuit board 3 with the first coil antenna 4, each antenna is soldered to separate area on the printed circuit board, which may create a different wave form contact between the two antennas that impairs the performance of the antennas.

Referring to FIGS. 3A-3F, the structure of the first exemplary embodiment of the integrated RFID tag and TPMS sensor 10A is shown. The integrated RFID tag and TPMS sensor 10A includes an RFID tag 32, which in turn includes an integrated circuit 34. The integrated circuit 34 is carried on a printed circuit board 36 and processes and stores data for the tire 12. More particularly, the integrated circuit 36 includes electronic memory capacity for storing identification (ID) information for each tire 12, known as tire ID information.

The tire ID information may include manufacturing information for the tire 12, such as: the tire type; tire model; size information, such as rim size, width, and outer diameter; manufacturing location; manufacturing date; a treadcap code that includes or correlates to a compound identification; and a mold code that includes or correlates to a tread structure identification. The tire ID information may also include a service history or other information to identify specific features and parameters of each tire 12, as well as mechanical characteristics of the tire.

The integrated circuit 34 also modulates and demodulates a radio frequency signal for communication with an external reader (not shown) through an antenna 40, which will be described in greater detail below.

A TPMS sensor 38 preferably is mounted on the RFID tag 32, and thus is in electronic communication with the integrated circuit 34 and the antenna 40. The TPMS sensor 38 preferably includes a pressure sensor that measures the pressure in the tire cavity 30, and may include a temperature sensor that measures the temperature in the tire cavity and/or another component of the tire 12. The TPMS sensor 38 may correlate the pressure and temperature measurements. Other sensors may also be mounted on the RFID tag 32, such as a stress sensor, a strain sensor, vibration sensor, accelerometer, and the like.

The antenna 40 preferably includes two coil antenna wires 42*a* and 42*b*, which are each formed in a helical shape. The antenna 40 receives and transmits a signal to the external reader using a radio frequency, thus facilitating communication between the integrated RFID tag and TPMS sensor 10A and the reader. The configuration of the RFID tag 32, integrated circuit 34, printed circuit board 36, TPMS sensor 38, and antenna 40 is more fully described in U.S. Patent Application Publication No. 2021/0016614, which is owned by the same Assignee as the present invention, The Goodyear Tire & Rubber Company, and is incorporated herein by reference in its entirety.

Each antenna wire 42*a* and 42*b* includes a first end 44*a* and 44*b*, respectively, which is mounted to the printed circuit board 36. For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The first embodiment of the integrated RFID tag and TPMS sensor 10A includes a mechanical interlock 50 between the first end 44*a* of the antenna wire 42*a* and the printed circuit board 36. The mechanical interlock 50 includes features that secure the first end 44*a* of the antenna wire 42*a* to the printed circuit board 36. More particularly, a straight slot 52 is formed in the printed circuit board 36 by milling or another forming technique. The slot 52 does not extend through the entire thickness of the printed circuit board 36. A corresponding straight slot 54 is formed in the solder pad 46, and the first end 44*a* of the antenna wire 42*a* is formed with a straight terminus 56. The straight terminus 56 of the antenna wire 42*a* seats in the aligned slots 52 and 54. In this manner, the printed circuit board 36 receives and mechanically engages the terminus 56 of the antenna wire 42*a*.

After the straight terminus 56 of the antenna wire 42*a* is engaged in the slots 52, 54, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The first embodiment of the integrated RFID tag and TPMS sensor 10A thus provides a mechanical interlock 50 between the first end 44*a*, 44*b* of each respective antenna 42*a*, 42*b* and the printed circuit board 36. The mechanical interlock 50 enables secure, convenient, and repeatable placement of each respective antenna 42*a*, 42*b* on the printed circuit board 36. By seating in the slots 52, 54, the length of each antenna wire 42*a*, 42*b* is controlled, creating a uniform wave form contact between the first and second antenna wires. The mechanical interlock 50 also enables easy soldering on a flat surface, which increases the durability of the bond between the antenna wires 42*a*, 42*b* and the printed circuit board 36.

Turning to FIGS. 4A-4F, the structure of a second exemplary embodiment of the integrated RFID tag and TPMS sensor 10B is shown. The second embodiment of the integrated RFID tag and TPMS sensor 10B includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The second embodiment of the integrated RFID tag and TPMS sensor 10B includes a mechanical interlock 58 between the first end 44*a* of the antenna wire 42*a* and the printed circuit board 36. The mechanical interlock 58 includes features that secure the first end 44*a* of the antenna wire 42*a* to the printed circuit board 36. More particularly, a circular slot 60 is formed in the printed circuit board 36 by milling or another forming technique. The slot 60 does not extend through the entire thickness of the printed circuit board 36. A corresponding circular slot 62 is formed in the solder pad 46, and the first end 44*a* of the antenna wire 42*a* is formed with a circular terminus 56. Preferably, the circular terminus 56 is formed by bending one pitch 66 of the first end 44*a* of the coiled antenna wire 42*a* to an angle that is about ninety (90) degrees relative to the remainder of the coiled antenna pitches. The circular terminus 64 of the antenna wire 42*a* seats in the aligned slots 60 and 62. In this manner, the printed circuit board 36 receives and mechanically engages the terminus 64 of the antenna wire 42*a*.

After the circular terminus 64 of the antenna wire 42*a* is engaged in the slots 60, 62, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The second embodiment of the integrated RFID tag and TPMS sensor 10B thus provides a mechanical interlock 58 between the first end 44*a*, 44*b* of each respective antenna 42*a*, 42*b* and the printed circuit board 36. The mechanical interlock 58 enables secure, convenient, and repeatable placement of each respective antenna 42*a*, 42*b* on the printed circuit board 36. By seating in the slots 60, 62, the length of each antenna wire 42*a*, 42*b* is controlled, creating a uniform wave form contact between the first and second antenna wires. The mechanical interlock 58 also enables easy soldering on a flat surface, which increases the durability of the bond between the antenna wires 42*a*, 42*b* and the printed circuit board 36.

Turning to FIGS. 5A-5H, the structure of a third exemplary embodiment of the integrated RFID tag and TPMS sensor 10C is shown. The third embodiment of the integrated RFID tag and TPMS sensor 10C includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The third embodiment of the integrated RFID tag and TPMS sensor 10C includes a mechanical interlock 68 between the first end 44*a* of the antenna wire 42*a* and the printed circuit board 36. The mechanical interlock 68 includes features that secure the first end 44*a* of the antenna wire 42*a* to the printed circuit board 36. More particularly, a straight slot 70 is formed in the printed circuit board 36 by milling or another forming technique. The slot 70 extends through the entire thickness of the printed circuit board 36. The slot 70 is positioned so that a distance between a top edge 74 of the printed circuit board 36 and a top 76 of the slot is less than an inside diameter 78 of the coiled antenna wire 42, creating an insert 86. A straight slot 80 is formed in the solder pad 46 and aligns with the slot 70 in the printed circuit board 36. A recess 82 is formed in the printed circuit board 36 near the straight slot 70, and does not extend through the thickness of the printed circuit board.

The first end 44*a* of the antenna wire 42*a* includes a terminus 84. The first end 44*a* of the antenna wire 42*a* engages the insert 86 of the printed circuit board 36, and the terminus 84 seats in the recess 82. In this manner, the printed circuit board 36 receives and mechanically engages the first end 44*a* and the terminus 84 of the antenna wire 42*a*. After the first end 44*a* of the antenna wire 42*a* engages the insert 86 of the printed circuit board 36, and the terminus 84 seats in the recess 82, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The third embodiment of the integrated RFID tag and TPMS sensor 10C thus provides a mechanical interlock 68 between the first end 44*a*, 44*b* of each respective antenna 42*a*, 42*b* and the printed circuit board 36. The mechanical interlock 68 enables secure, convenient, and repeatable placement of each respective antenna 42*a*, 42*b* on the printed circuit board 36. The interlock 68 also enables the length of each antenna wire 42*a*, 42*b* to be controlled, creating a uniform wave form contact between the first and second antenna wires. The mechanical interlock 68 further enables easy soldering, which increases the durability of the bond between the antenna wires 42*a*, 42*b* and the printed circuit board 36.

Turning to FIGS. 6A-6E, the structure of a fourth exemplary embodiment of the integrated RFID tag and TPMS sensor 10D is shown. The fourth embodiment of the integrated RFID tag and TPMS sensor 10D includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The fourth embodiment of the integrated RFID tag and TPMS sensor 10D includes a mechanical interlock 88 between the first end 44*a* of the antenna wire 42*a* and the printed circuit board 36. The mechanical interlock 88 includes features that secure the first end 44*a* of the antenna wire 42*a* to the printed circuit board 36.

More particularly, a first slot 90 is formed in the printed circuit board 36 by milling or another forming technique. The first slot 90 extends in a straight manner across the printed circuit board 36, with a semi-circular cross section through the entire thickness of the printed circuit board 36. A second slot 92 is formed in the printed circuit board 36 by milling or another forming technique. The second slot 92 extends in a straight manner across the printed circuit board 36 parallel to the first slot 90, with a semi-circular cross section through the entire thickness of the printed circuit board 36. The slots 90 and 92 are of an equal length, and are positioned so that a distance 94 between a bottom edge 96 of the first slot and a top edge 98 of the second slot is less than an inside diameter 100 of the coiled antenna wire 42, creating an insert 102. A first slot 104 is formed in the solder pad 46 in alignment with the first slot 90 in the printed circuit board 36, and a second slot 106 is formed in the solder pad in alignment with the second slot 92 in the printed circuit board.

The first end 44*a* of the antenna wire 42*a* engages the insert 102 of the printed circuit board 36. In this manner, the printed circuit board 36 receives and mechanically engages the first end 44*a* of the antenna wire 42*a*. After the first end 44*a* of the antenna wire 42*a* engages the insert 102 of the printed circuit board 36, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The fourth embodiment of the integrated RFID tag and TPMS sensor 10D thus provides a mechanical interlock 88 between the first end 44*a*, 44*b* of each respective antenna 42*a*, 42*b* and the printed circuit board 36. The mechanical interlock 88 enables secure, convenient, and repeatable placement of each respective antenna 42*a*, 42*b* on the printed circuit board 36. The interlock 88 also enables the length of each antenna wire 42*a*, 42*b* to be controlled, creating a uniform wave form contact between the first and second antenna wires. The mechanical interlock 88 further enables easy soldering, which increases the durability of the bond between the antenna wires 42*a*, 42*b* and the printed circuit board 36.

Turning to FIGS. 7A-7F, the structure of a fifth exemplary embodiment of the integrated RFID tag and TPMS sensor 10E is shown. The fifth embodiment of the integrated RFID tag and TPMS sensor 10E includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The fifth embodiment of the integrated RFID tag and TPMS sensor 10E includes a mechanical interlock 108 between the first end 44*a* of the antenna wire 42*a* and the printed circuit board 36. The mechanical interlock 108 includes features that secure the first end 44*a* of the antenna wire 42*a* to the printed circuit board 36.

More particularly, a first slot 110 is formed in the printed circuit board 36 by milling or another forming technique. The first slot 110 extends in a straight manner across the printed circuit board 36, with a semi-circular cross section through the entire thickness of the printed circuit board 36. A second slot 112 is formed in the printed circuit board 36 by milling or another forming technique. The second slot 112 extends in a straight manner across the printed circuit board 36 parallel to the first slot 110, with a semi-circular cross section through the entire thickness of the printed circuit board 36. The second slot 112 is formed with a length that is greater than a length of the first slot 110. The slots 110 and 112 are positioned so that a distance 114 between a bottom edge 116 of the first slot and a top edge 118 of the second slot is less than an inside diameter 120 of the coiled antenna wire 42, creating an insert 122. A first slot 124 is formed in the solder pad 46 in alignment with the first slot 110 in the printed circuit board 36, and a second slot 126 is formed in the solder pad in alignment with the second slot 112 in the printed circuit board.

A recess 128 is formed in the printed circuit board 36 near the first slot 110, and does not extend through the thickness of the printed circuit board. The first end 44*a* of the antenna wire 42*a* includes a terminus 130. The first end 44*a* of the antenna wire 42*a* engages the insert 122 of the printed circuit board 36, and the terminus 130 seats in the recess 128. In this manner, the printed circuit board 36 receives and mechanically engages the first end 44*a* and the terminus 130 of the antenna wire 42*a*. After the first end 44*a* of the antenna wire 42*a* engages the insert 122 of the printed circuit board 36, and the terminus 130 seats in the recess 128, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The fifth embodiment of the integrated RFID tag and TPMS sensor 10E thus provides a mechanical interlock 108 between the first end 44*a*, 44*b* of each respective antenna 42*a*, 42*b* and the printed circuit board 36. The mechanical interlock 108 enables secure, convenient, and repeatable placement of each respective antenna 42*a*, 42*b* on the printed circuit board 36. The interlock 108 also enables the length of each antenna wire 42*a*, 42*b* to be controlled, creating a uniform wave form contact between the first and second antenna wires. The mechanical interlock 108 further enables easy soldering, which increases the durability of the bond between the antenna wires 42*a*, 42*b* and the printed circuit board 36.

Turning to FIGS. 8A-8F, the structure of a sixth exemplary embodiment of the integrated RFID tag and TPMS sensor 10F is shown. The sixth embodiment of the integrated RFID tag and TPMS sensor 10F includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The sixth embodiment of the integrated RFID tag and TPMS sensor 10F includes a mechanical interlock 132 between the first end 44*a* of the antenna wire 42*a* and the printed circuit board 36. The mechanical interlock 132 includes features that secure the first end 44*a* of the antenna wire 42*a* to the printed circuit board 36.

More particularly, a first slot 134 is formed in the printed circuit board 36 by milling or another forming technique. The first slot 134 extends in a straight manner across the printed circuit board 36, with a straight cross section through the entire thickness of the printed circuit board 36. A second slot 136 is formed in the printed circuit board 36 by milling or another forming technique. The second slot 136 extends in a straight manner across the printed circuit board 36 parallel to the first slot 134, with a straight cross section through the entire thickness of the printed circuit board 36. The second slot 136 is formed with a length that is greater than a length of the first slot 134. The slots 134 and 136 are positioned so that a distance 138 between a bottom edge 140 of the first slot and a top edge 142 of the second slot is less than an inside diameter 144 of the coiled antenna wire 42, creating an insert 146. A first slot 148 is formed in the solder pad 46 in alignment with the first slot 134 in the printed circuit board 36, and a second slot 150 is formed in the solder pad in alignment with the second slot 136 in the printed circuit board.

A recess 152 is formed in the printed circuit board 36 near the first slot 134, and does not extend through the thickness of the printed circuit board. The first end 44*a* of the antenna wire 42*a* includes a terminus 154. The first end 44*a* of the antenna wire 42*a* engages the insert 146 of the printed circuit board 36, and the terminus 154 seats in the recess 152. In this manner, the printed circuit board 36 receives and mechanically engages the first end 44*a* and the terminus 154 of the antenna wire 42*a*. After the first end 44*a* of the antenna wire 42*a* engages the insert 146 of the printed circuit board 36, and the terminus 154 seats in the recess 152, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The sixth embodiment of the integrated RFID tag and TPMS sensor 10F thus provides a mechanical interlock 132 between the first end 44*a*, 44*b* of each respective antenna 42*a*, 42*b* and the printed circuit board 36. The mechanical interlock 132 enables secure, convenient, and repeatable placement of each respective antenna 42*a*, 42*b* on the printed circuit board 36. The interlock 132 also enables the length of each antenna wire 42*a*, 42*b* to be controlled, creating a uniform wave form contact between the first and second antenna wires. The mechanical interlock 132 further enables easy soldering, which increases the durability of the bond between the antenna wires 42*a*, 42*b* and the printed circuit board 36.

Turning to FIGS. 9A-9F, the structure of a seventh exemplary embodiment of the integrated RFID tag and TPMS sensor 10G is shown. The seventh embodiment of the integrated RFID tag and TPMS sensor 10G includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The seventh embodiment of the integrated RFID tag and TPMS sensor 10G includes a mechanical interlock 156 between the first end 44*a* of the antenna wire 42*a* and the printed circuit board 36. The mechanical interlock 156 includes features that secure the first end 44*a* of the antenna wire 42*a* to the printed circuit board 36. More particularly, a first slot 158 is formed in the printed circuit board 36 by milling or another forming technique. The first slot 134 extends in a straight manner into the printed circuit board 36, with a straight cross section through the entire thickness of the printed circuit board 36. A first opening 162 is formed in the printed circuit board 36 in parallel alignment with the first slot 134, and extends through the printed circuit board. A distance 174 between the first slot 158 and the first opening 162 matches a pitch 176 of the coiled antenna wire 42*a*.

A second slot 164 is formed in the printed circuit board 36 by milling or another forming technique. The second slot 164 extends into the printed circuit board 36 parallel to the first slot 158 for a distance that is less than the first slot, with a straight cross section through the entire thickness of the printed circuit board. The second slot 164 is formed with a length that is less than or shorter than a length of the first slot 158. A second opening 166 is formed in the printed circuit board 36 in parallel alignment with the second slot 164, and extends through the printed circuit board. A third opening 168 is formed in the printed circuit board 36 in parallel alignment with the second slot 164 and the second opening 166, and extends through the printed circuit board. A distance 178 between the second slot 164 and the second opening 166 matches the pitch 176 of the coiled antenna wire 42*a*, and a distance 180 between the second opening 166 and the third opening 168 also matches the pitch of the coiled antenna wire.

The first slot 158 and the first opening 162 are spaced apart from the second slot 164, the second opening 166, and the third opening 168, creating a distance 170 that is slightly less than an inside diameter 172 of the coiled antenna wire 42. A slot 182 is formed in the solder pad 46 in alignment with the first slot 158 in the printed circuit board 36, a first opening 184 is formed in the solder pad in alignment with the first opening 162, a second opening 186 is formed in the solder pad in alignment with the second opening 166, and a third opening 188 is formed in the solder pad in alignment with the third opening 168.

A recess 190 is formed in the printed circuit board 36 parallel to and near the first opening 162, and does not extend through the thickness of the printed circuit board. A distance 192 between the first opening 162 and the recess 190 matches the pitch 176 of the coiled antenna wire 42*a*. The first end 44*a* of the antenna wire 42*a* includes a terminus 194. This structure enables the first end 44*a* of the antenna wire 42*a* to wind through the first slot 158, the second slot 164, the first opening 162, the second opening 166, and the third opening 168, with the terminus 194 seating in the recess 190. In this manner, the printed circuit board 36 receives and mechanically engages the first end 44*a* and the terminus 194 of the antenna wire 42*a*.

After the first end 44*a* of the antenna wire 42*a* engages the first slot 158, the second slot 164, the first opening 162, the second opening 166, and the third opening 168, and the terminus 194 seats in the recess 190, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The seventh embodiment of the integrated RFID tag and TPMS sensor 10G thus provides a mechanical interlock 156 between the first end 44*a*, 44*b* of each respective antenna 42*a*, 42*b* and the printed circuit board 36. The mechanical interlock 156 enables secure, convenient, and repeatable placement of each respective antenna 42*a*, 42*b* on the printed circuit board 36. The interlock 156 also enables the length of each antenna wire 42*a*, 42*b* to be controlled, creating a uniform wave form contact between the first and second antenna wires. The mechanical interlock 156 further enables easy soldering, which increases the durability of the bond between the antenna wires 42*a*, 42*b* and the printed circuit board 36.

Turning to FIGS. 10A-10G, the structure of an eighth exemplary embodiment of the integrated RFID tag and TPMS sensor 10H is shown. The eighth embodiment of the integrated RFID tag and TPMS sensor 10H includes an RFID tag 32, integrated circuit 34, printed circuit board 36, TPMS sensor 38, and antenna 40 in a configuration that is similar to the description provided above for the first embodiment of the integrated RFID tag and TPMS sensor 10A. The antenna 40 also includes a first antenna wire 42*a* and a second antenna wire 42*b*, each of which includes a first end 44*a* and 44*b*, respectively, also as described above.

For the purpose of convenience, the connection of the first antenna wire 42*a* to the printed circuit board 36 will be described, with the understanding that the description also applies to the connection of the second antenna wire 42*b* to the printed circuit board. A solder pad 46 preferably is formed on the printed circuit board 36, and the first end 44*a* of the antenna 42*a* is mounted to the solder pad with solder 48. The first end 44*a* of the antenna 42*a* is electrically connected to the integrated circuit 34 through conductive traces on the printed circuit board 36 that extend between the solder pad 46 and the integrated circuit.

The eighth embodiment of the integrated RFID tag and TPMS sensor 10H includes a mechanical interlock 196 between the first end 44*a* of the antenna wire 42*a* and the printed circuit board 36. The mechanical interlock 196 includes features that secure the first end 44*a* of the antenna wire 42*a* to the printed circuit board 36. More particularly, a first opening 198 is formed in the printed circuit board 36 by milling or another forming technique, and extends through the printed circuit board. A second opening 200 is formed in the printed circuit board 36 in parallel alignment with the first opening 198, and extends through the printed circuit board. A distance 206 between the first opening 198 and the second opening 200 matches a pitch 208 of the coiled antenna wire 42*a*.

The first opening 198 and the second opening 200 are spaced apart from a top edge 202 of the printed circuit board 36, creating a distance 204 that is slightly less than an inside diameter 210 of the coiled antenna wire 42. A first opening 212 is formed in the solder pad 46 in alignment with the first opening 198 in the printed circuit board 36, and a second opening 214 is formed in the solder pad in alignment with the second opening 214. A recess 216 is formed in the printed circuit board 36 parallel to and near the second opening 200, and does not extend through the thickness of the printed circuit board. A distance 218 between the second opening 200 and the recess 216 matches the pitch 208 of the coiled antenna wire 42*a*. The first end 44*a* of the antenna wire 42*a* includes a terminus 220.

This structure enables the first end 44*a* of the antenna wire 42*a* to wind over the top edge 202 of the printed circuit board 36, through the first opening 198, and through the second opening 200, with the terminus 220 seating in the recess 216. In this manner, the printed circuit board 36 receives and mechanically engages the first end 44*a* and the terminus 220 of the antenna wire 42*a*. After the first end 44*a* of the antenna wire 42*a* engages the top edge 202 of the printed circuit board 36, the first opening 198, and the second opening 200, and the terminus 220 seats in the recess 216, the solder 48 preferably is deposited on the solder pad 46 to secure the connection of the antenna wire to the printed circuit board 36. As mentioned above, the second antenna wire 42*b* is connected to the printed circuit board 36 in the same manner as the first antenna wire 42*a*.

The eighth embodiment of the integrated RFID tag and TPMS sensor 10H thus provides a mechanical interlock 196 between the first end 44*a*, 44*b* of each respective antenna 42*a*, 42*b* and the printed circuit board 36. The mechanical interlock 196 enables secure, convenient, and repeatable placement of each respective antenna 42*a*, 42*b* on the printed circuit board 36. The interlock 196 also enables the length of each antenna wire 42*a*, 42*b* to be controlled, creating a uniform wave form contact between the first and second antenna wires. The mechanical interlock 196 further enables easy soldering, which increases the durability of the bond between the antenna wires 42*a*, 42*b* and the printed circuit board 36.

In this manner, the integrated RFID tag and TPMS sensor 10A-10H of the present invention employs a structure that includes an antenna connection to a printed circuit board 36 which provides consistent placement and alignment of the antenna 40 for optimum performance. The printed circuit board 36 includes features that guide the antenna coil 44*a*, 44*b* for optimum placement, thereby simplifying repeatable antenna placement. The features preferably are formed in the printed circuit board 36 during manufacture of the board, desirably eliminating the need for special forming tools or processes.

The mechanical interlock of the integrated RFID tag and TPMS sensor 10A-10H of the present invention includes features that ensure consistent and repeatable installation of each respective antenna 42*a*, 42*b* on the printed circuit board 36, which in turn ensures performance of the antenna. The mechanical interlock features of the integrated RFID tag and TPMS sensor 10A-10H also enable the length of each antenna wire 42*a*, 42*b* to be controlled, creating a uniform wave form contact between the first and second antenna wires. The mechanical interlock features further enable easy soldering, which increases the durability of the bond between the antenna wires 42*a*, 42*b* and the printed circuit board 36.

The present invention also includes a method of forming an integrated RFID tag and TPMS sensor 10A-10H. The method includes steps in accordance with the description that is presented above and shown in FIGS. 1 and 3A-10G. It is to be understood that the structure of the above-described the integrated RFID tag and TPMS sensor 10A-10H may be altered or rearranged, or components known to those skilled in the art omitted or added, without affecting the overall concept or operation of the invention. For example, the integrated RFID tag and TPMS sensor 10A-10H may be formed as an integrated unit as described above, or may be formed with a separable RFID tag and TPMS sensor.

The invention has been described with reference to preferred embodiments. Potential modifications and alterations will occur to others upon a reading and understanding of this description. It is to be understood that all such modifications and alterations are included in the scope of the invention as set forth in the appended claims, or the equivalents thereof.

What is claimed is:

1. An integrated radio frequency identification tag and tire pressure monitoring system sensor comprising:

a radio frequency identification tag, the radio frequency identification tag including an integrated circuit;

a printed circuit board carrying the integrated circuit;

a tire pressure monitoring system sensor being mounted on the radio frequency identification tag;

an antenna including at least one coil antenna wire, the at least one antenna wire being formed in a helical shape and being electrically connected to the integrated circuit;

the at least one coil antenna wire including a first end that is mounted to the printed circuit board; and a mechanical interlock between the first end of the coil antenna wire and the printed circuit board, the mechanical interlock including a feature securing the first end of the coil antenna wire to the printed circuit board, wherein the feature includes a straight slot formed in the printed circuit board, the straight slot extending through a thickness of the printed circuit board and being positioned to create an insert between a top edge of the printed circuit board and the straight slot, wherein the insert is less than an inside diameter of the coil antenna wire and the first end of the coil antenna wire engages the insert.

2. The integrated radio frequency identification tag and tire pressure monitoring system sensor of claim 1, wherein a recess is formed in the printed circuit board near the straight slot and does not extend through the thickness of the printed circuit board, and wherein the first end of the coil antenna wire includes a terminus that seats in the recess.

3. The integrated radio frequency identification tag and tire pressure monitoring system sensor of claim 1, further comprising a solder pad formed on the printed circuit board, wherein the first end of the antenna is mounted to the solder pad with solder.

4. The integrated radio frequency identification tag and tire pressure monitoring system sensor of claim 1, further comprising a pneumatic tire, the integrated radio frequency identification tag and tire pressure monitoring system sensor being mounted to the pneumatic tire.

* * * * *